(12) United States Patent
Catabay et al.

(10) Patent No.: US 6,756,674 B1
(45) Date of Patent: Jun. 29, 2004

(54) LOW DIELECTRIC CONSTANT SILICON OXIDE-BASED DIELECTRIC LAYER FOR INTEGRATED CIRCUIT STRUCTURES HAVING IMPROVED COMPATIBILITY WITH VIA FILLER MATERIALS, AND METHOD OF MAKING SAME

(75) Inventors: Wilbur G. Catabay, Saratoga, CA (US); Wei-Jen Hsia, Sunnyvale, CA (US); Weidan Li, San Jose, CA (US); Joe W. Zhao, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/426,061

(22) Filed: Oct. 22, 1999

(51) Int. Cl.[7] .......................... H01L 23/48; H01L 23/52; H01L 29/40
(52) U.S. Cl. ...................... 257/758; 257/774; 257/759
(58) Field of Search .............................. 257/758, 774, 257/759

(56) References Cited

U.S. PATENT DOCUMENTS

| 3,012,861 A | 12/1961 | Ling ........................... 23/223.5 |
| 3,178,392 A | 4/1965 | Kriner ......................... 260/46.5 |
| 3,652,331 A | 3/1972 | Yamazaki ..................... 117/201 |
| 3,832,202 A | 8/1974 | Ritchie ........................ 106/287 |
| 3,920,865 A | 11/1975 | Läufer et al. ................ 427/220 |
| 4,705,725 A | 11/1987 | Glajch et al. ................ 428/405 |

(List continued on next page.)

FOREIGN PATENT DOCUMENTS

| DE | 198 04 375 A1 | 7/1999 | ......... H01L/21/312 |
| EP | 0 706 216 A2 | 4/1996 | ......... H01L/23/532 |

(List continued on next page.)

OTHER PUBLICATIONS

Peters, Laura, "Pursuing the Perfect Low–k Dielectric", *Semiconductor International*, vol. 21, No. 10, Sep., 1998, pp. 64–66, 68, 70, 72, and 74.

(List continued on next page.)

*Primary Examiner*—Bradley Baumeister
(74) *Attorney, Agent, or Firm*—John P. Taylor

(57) ABSTRACT

An integrated circuit structure is disclosed wherein the capacitance between nearby conductive portions may be lowered using carbon-containing low k silicon oxide dielectric material, without contributing to the problem of via poisoning, by careful control of the carbon content of the dielectric material in two regions of the integrated circuit structure. The first region comprises the region between adjacent raised conductive lines formed over an underlying insulation layer, where undesirable capacitance may be formed horizontally between such adjacent conductive lines, while the second region comprises the region above the raised conductive lines where vias are normally formed extending upward from the raised conductive lines through the dielectric layer to an overlying layer of metal interconnects. In one embodiment, the carbon-containing low k silicon oxide dielectric material used in the first region between adjacent raised conductive lines has a high carbon content to provide maximum reduction of the dielectric constant of the dielectric material for maximum reduction in the horizontal capacitance developed between horizontally adjacent lines, while the carbon-containing low k silicon oxide dielectric material used in the second region above the raised conductive lines has a reduced carbon content to mitigate poisoning of vias formed through the dielectric material in this second region. In another embodiment both the first and second regions have the same or similar reduced carbon content in the carbon-containing low k silicon oxide dielectric material used in both of the respective first and second regions to thereby provide a carbon content sufficient to lower the undesirable capacitance formed horizontally between said adjacent raised conductive lines in said first region, but insufficient to cause via poisoning in vias formed in said second region.

24 Claims, 6 Drawing Sheets

U.S. PATENT DOCUMENTS

| | | |
|---|---|---|
| 4,771,328 A | 9/1988 | Malaviya et al. ............. 357/49 |
| 5,194,333 A | 3/1993 | Ohnaka et al. ............. 428/405 |
| 5,302,233 A | 4/1994 | Kim et al. |
| 5,314,845 A | 5/1994 | Lee et al. .................... 437/238 |
| 5,364,800 A | 11/1994 | Joyner .......................... 437/28 |
| 5,376,595 A * | 12/1994 | Zupancic et al. ............. 501/12 |
| 5,470,801 A | 11/1995 | Kapoor et al. .............. 437/238 |
| 5,558,718 A | 9/1996 | Leung .................... 118/723 E |
| 5,559,367 A * | 9/1996 | Cohen et al. .................. 257/77 |
| 5,580,429 A | 12/1996 | Chan et al. ............ 204/192.38 |
| 5,628,871 A | 5/1997 | Shinagawa ................... 438/514 |
| 5,675,187 A * | 10/1997 | Numata et al. ............. 257/758 |
| 5,688,724 A | 11/1997 | Yoon et al. ................. 437/235 |
| 5,708,303 A | 1/1998 | Jeng |
| 5,818,111 A | 10/1998 | Jeng et al. |
| 5,821,621 A | 10/1998 | Jeng |
| 5,858,870 A | 1/1999 | Zheng et al. |
| 5,858,879 A | 1/1999 | Chao et al. .................. 438/725 |
| 5,864,172 A | 1/1999 | Kapoor et al. .............. 257/634 |
| 5,874,367 A | 2/1999 | Dobson ...................... 438/787 |
| 5,874,745 A | 2/1999 | Kuo ............................ 257/59 |
| 5,882,489 A | 3/1999 | Bersin et al. .......... 204/192.35 |
| 5,904,154 A | 5/1999 | Chien et al. ................. 134/1.2 |
| 5,913,140 A | 6/1999 | Roche et al. |
| 5,915,203 A | 6/1999 | Sengupta et al. ........... 438/669 |
| 5,939,763 A | 8/1999 | Hao et al. ................... 257/411 |
| 5,990,013 A * | 11/1999 | Berenguer et al. .......... 438/706 |
| 6,025,263 A | 2/2000 | Tsai et al. ................... 438/624 |
| 6,028,015 A * | 2/2000 | Wang et al. ................. 438/789 |
| 6,037,248 A * | 3/2000 | Ahn ........................... 438/619 |
| 6,043,167 A | 3/2000 | Lee et al. .................... 438/789 |
| 6,051,073 A | 4/2000 | Chu et al. ................... 118/723 |
| 6,051,477 A | 4/2000 | Nam .......................... 438/404 |
| 6,057,242 A | 5/2000 | Kishimoto |
| 6,066,574 A | 5/2000 | You et al. ................... 438/781 |
| 6,114,259 A | 9/2000 | Sukharev et al. ........... 438/789 |
| 6,114,766 A | 9/2000 | Shields |
| 6,147,012 A | 11/2000 | Sukharev et al. ........... 438/787 |
| 6,153,524 A | 11/2000 | Henley et al. .............. 438/691 |
| 6,191,050 B1 | 2/2001 | Andideh |
| 6,204,192 B1 | 3/2001 | Zhao et al. ................. 438/723 |

FOREIGN PATENT DOCUMENTS

| | | | |
|---|---|---|---|
| EP | 0 949 663 A2 | 10/1999 | ......... H01L/21/312 |
| JP | 63003437 | 1/1988 | .......... H01L/21/90 |
| JP | 2000267128 A * | 3/1999 | |
| WO | WO 99/41423 | 8/1999 | |

OTHER PUBLICATIONS

Koda, Seiichiro, et al., "A Study of Inhibition Effects for Silane Combustion by Additive Gases", *Comustion and Flame*, vol. 73, No. 2, Aug., 1988, pp. 187–194.

Bothra, S., et al., "Integration of 0.25 $\mu$m Three and Five Level Interconnect System for High Performance ASIC", *1997 Proceedings Fourteenth International VMIC Conference*, Santa Clara, CA, Jun. 10–12, 1997, pp. 43–48.

Dobson, C.D., et al., "Advanced $SiO_2$ Planarization Using Silane and $H_2O_2$", *Semiconductor International*, Dec. 1994, pp. 85–88.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Sugahara, Satoshi, et al., "Chemical Vapor Deposition of $CF_3$–Incorporated Silica Films for Interlayer Dielectric Application", 1999 Joint International Meeting, *Electrochemical Society Meeting Abstracts*, vol. 99–2, 1999, Abstract No. 746.

* cited by examiner

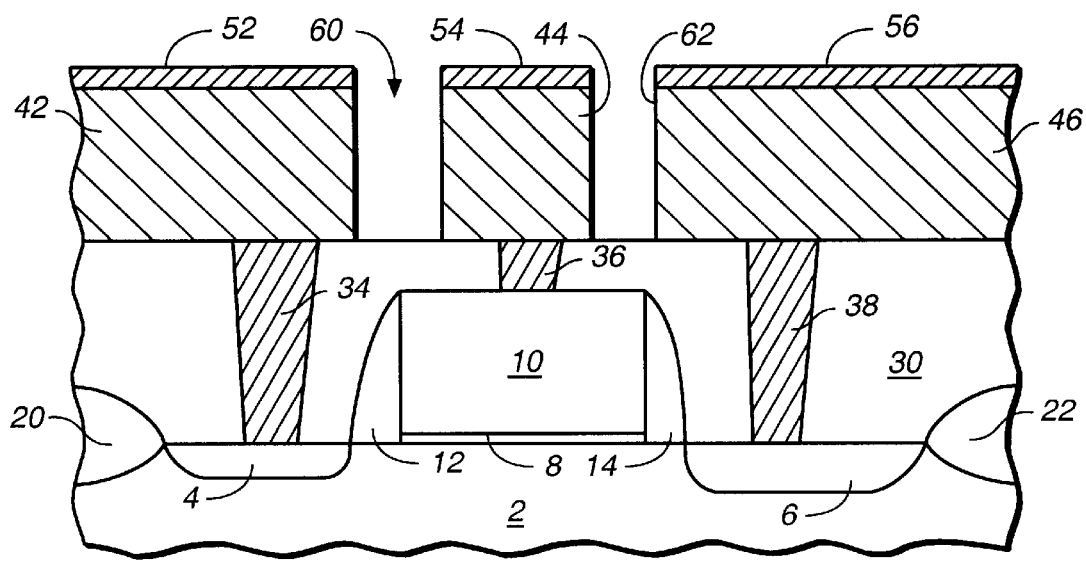
FIG._1
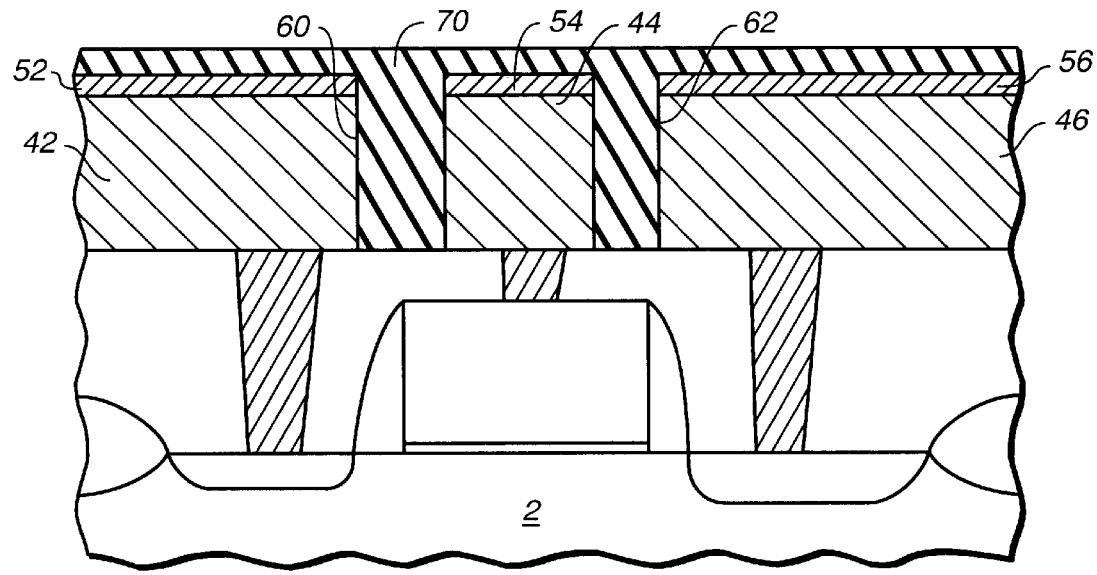
FIG._2

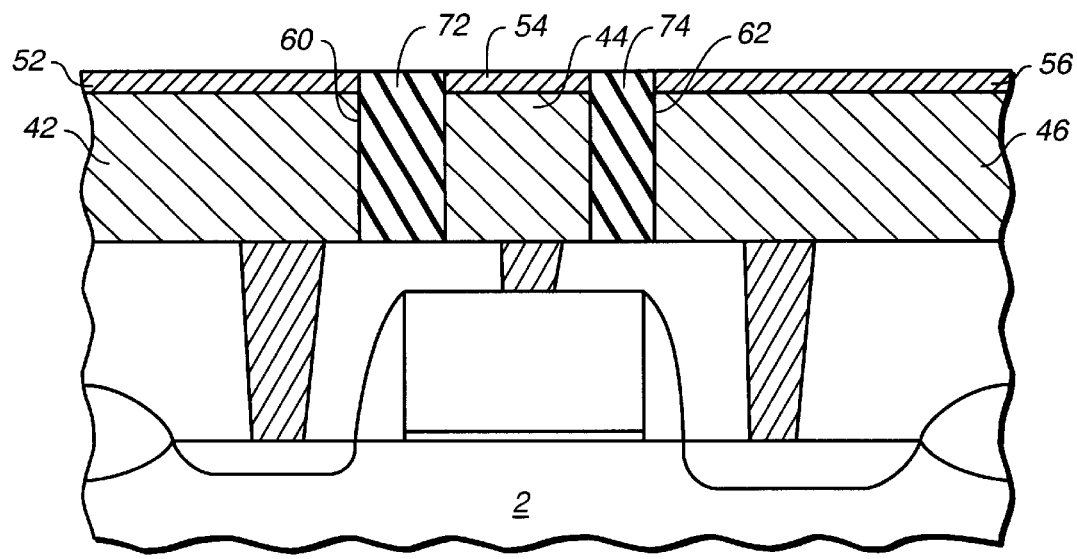
FIG._3
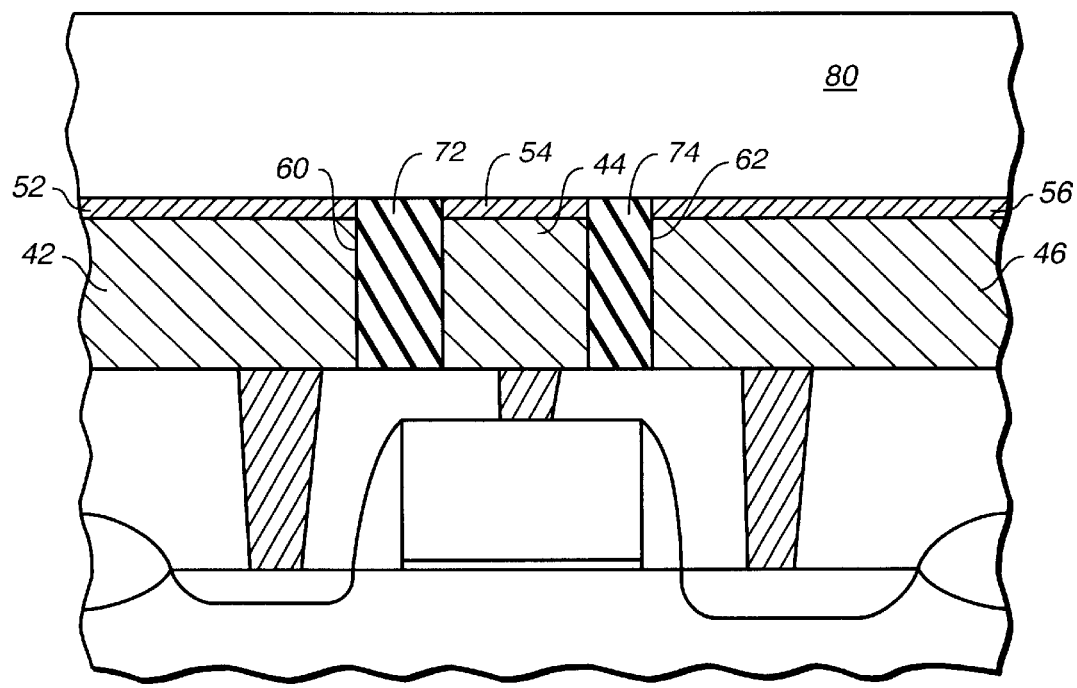
FIG._4

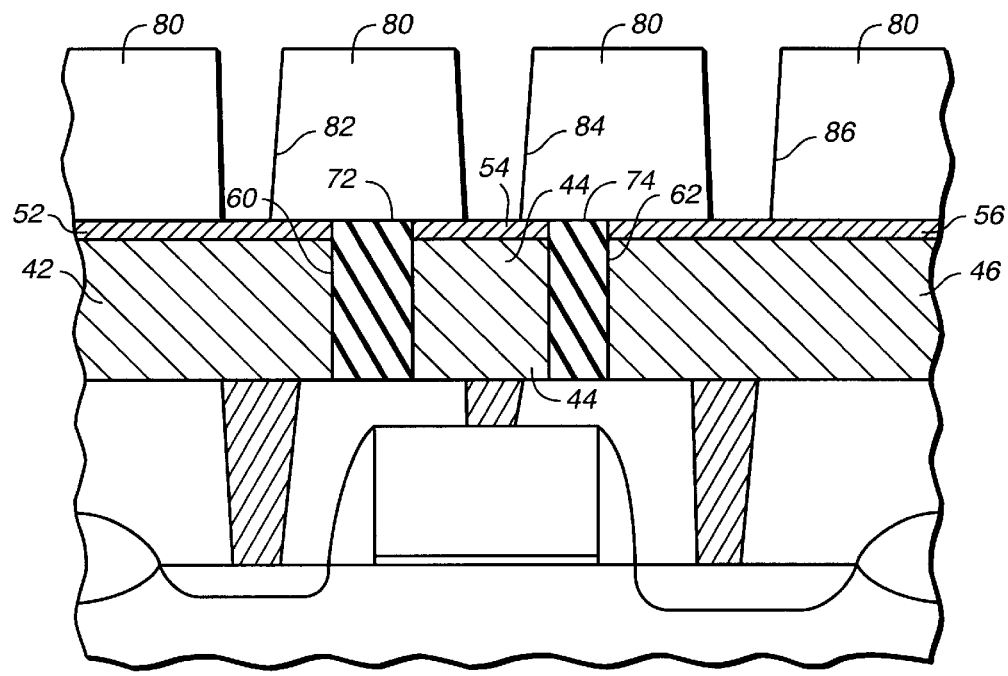
FIG._5
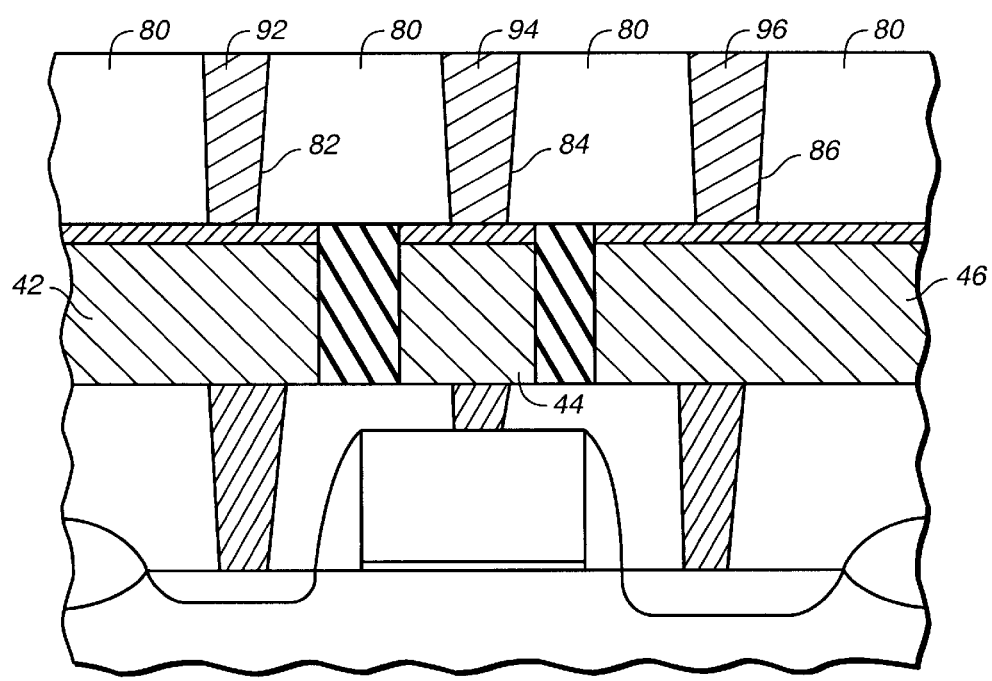
FIG._6

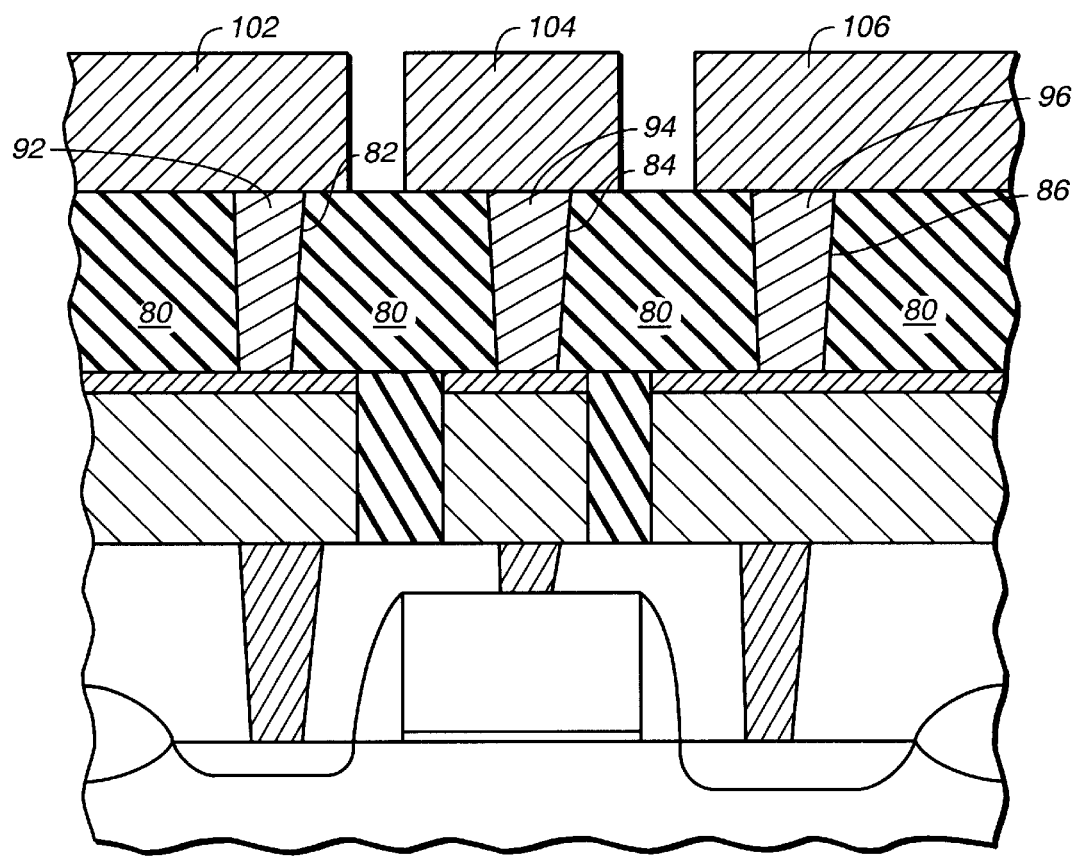
FIG._7

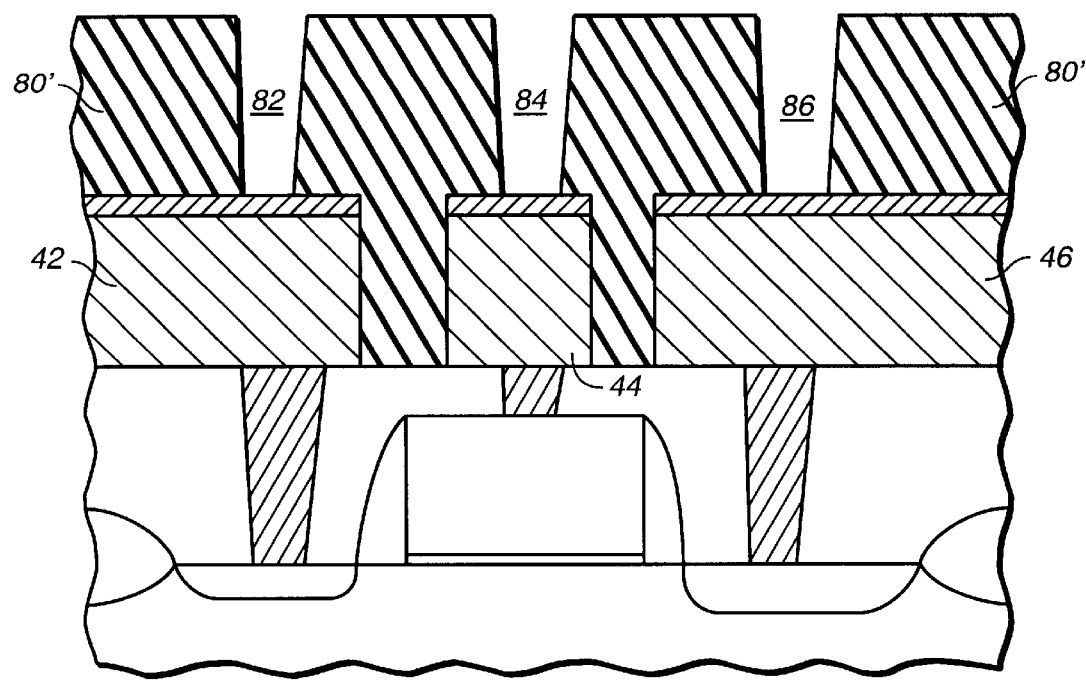
FIG._8
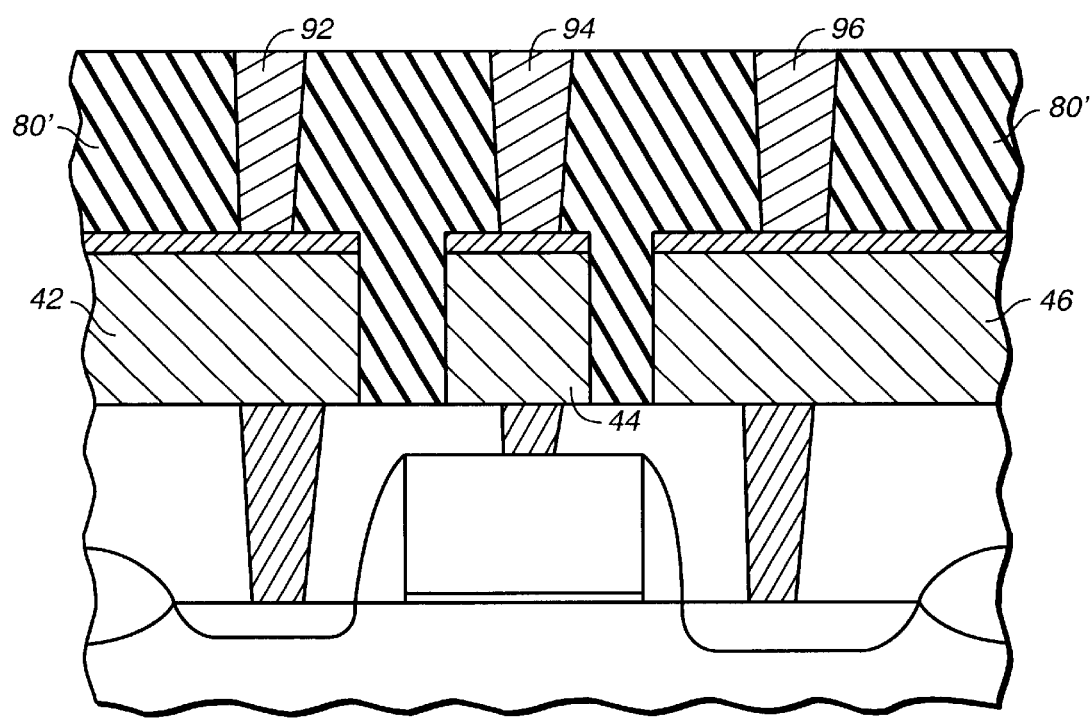
FIG._9

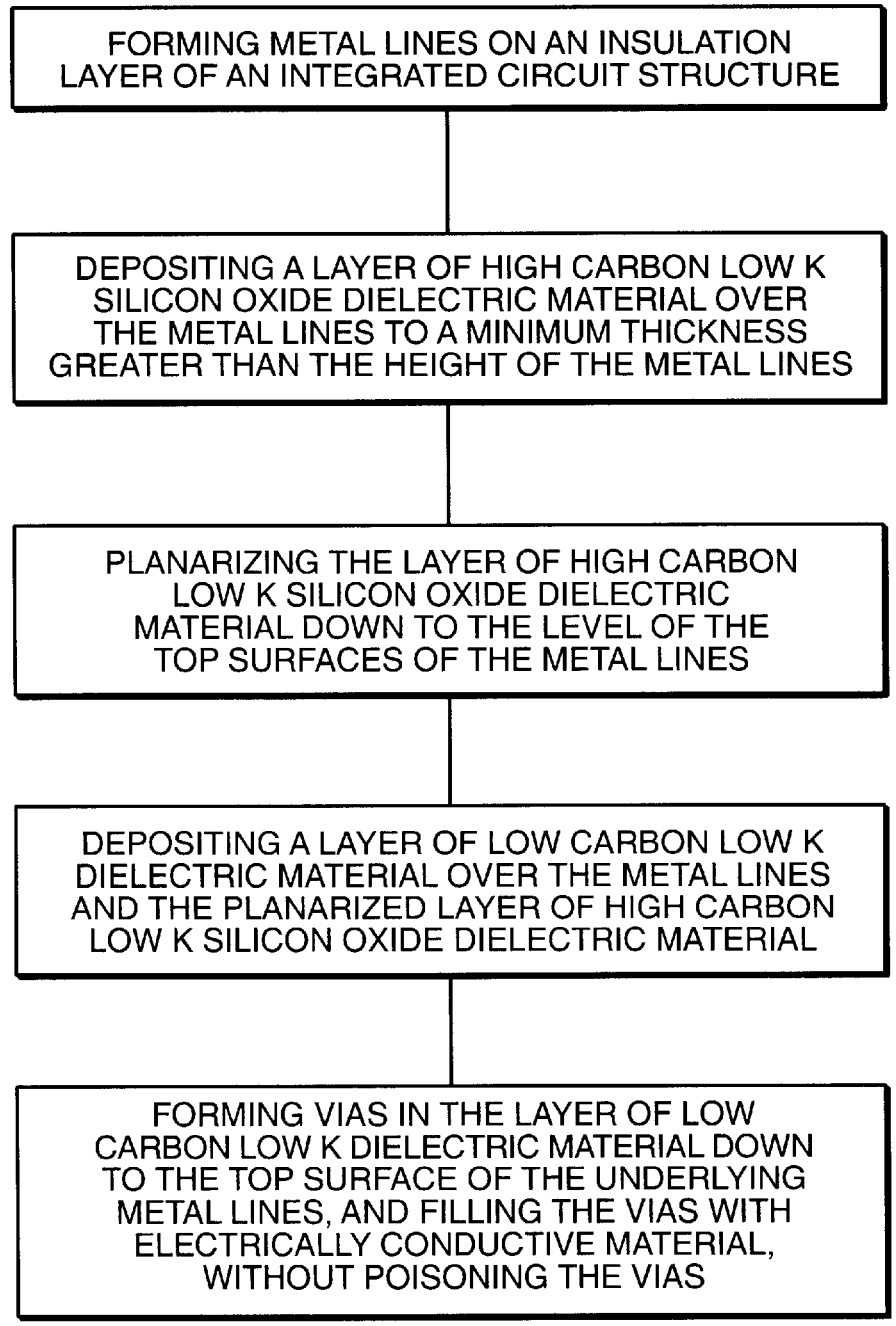
FIG._10

LOW DIELECTRIC CONSTANT SILICON OXIDE-BASED DIELECTRIC LAYER FOR INTEGRATED CIRCUIT STRUCTURES HAVING IMPROVED COMPATIBILITY WITH VIA FILLER MATERIALS, AND METHOD OF MAKING SAME

BACKGROUND OF THE INVENTION

1. Field of the Invention

This invention relates to integrated circuit structures. More particularly, this invention relates to a low dielectric constant (low k) material used in an insulation layer of an integrated circuit structure wherein the low k dielectric material exhibits improved compatibility with conductive materials used as conductive fillers for vias/contact openings formed in the low k dielectric material, and to a method of making such improved low k dielectric material.

2. Description of the Related Art

The shrinking of integrated circuits has resulted in levels of interconnects, including metal interconnects, being placed closer together, as well as reduction of the horizontal spacing between metal lines on any particular level of such interconnects. As a result, capacitance has increased between such conductive portions, resulting in loss of speed and increased cross-talk. One proposed approach to solving this problem of high capacitance is to replace the conventional silicon oxide ($SiO_2$) dielectric material, having a dielectric constant (k) of about 4.0, with another insulation material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of such alternate dielectric materials are disclosed and discussed. Included in these dielectric materials is a description of a low k dielectric material having a dielectric constant of about 3.0 formed using a Flowfill chemical vapor deposition (CVD) process developed by Trikon Technologies of Newport, Gwent, U.K. The process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture. The article goes on to state that beyond methyl silane, studies show a possible k of 2.75 using dimethyl silane in the Flowfill process. The Peters article further states that in high density plasma (HDP) CVD, dielectric material formed from methyl silane or dimethyl silane and $O_2$ can provide a k as low as 2.75; and that trimethyl silane, available from Dow-Corning, can be used to deposit low-k (2.6) dielectric films.

An article by S. McClatchie et al. entitled "Low Dielectric Constant Oxide Films Deposited Using CVD Techniques", published in the 1998 Proceedings of the Fourth International Dielectrics For ULSI Multilevel Interconnection Conference (Dumic) held on Feb. 16–17, 1998 at Santa Clara, Calif., at pages 311–318, also describes the formation of methyl-doped silicon oxide by the low-k Flowfill process of reacting methyl silane with $H_2O_2$ to achieve a dielectric constant of ~2.9. The authors then further describe the formation of low-k dielectric material using dimethyl silane ($CH_3$)$_2$—$SiH_2$, thereby achieving a dielectric constant of ~2.75. However, the authors point out that the methyl silane and the dimethyl silane both result in carbon being bound into the oxide lattice via a Si—$CH_3$ bond which results in the termination of the siloxane chain. The authors further state that the addition of further $CH_3$ groups bound to the silicon atom is thought to be prohibitive because an increase in the number of $CH_3$ groups reduces the number of sites available to form the siloxane chain. Instead, the authors reported taking a different approach by incorporating the carbon as part of the siloxane chain itself so that the siloxane chain would not be broken. The authors then report on the use of methylenebis-silane ($SiH_3$—$CH_2$—$SiH_3$) instead of methyl silane as the precursor material reacted with $H_2O_2$ whereby the $SiH_3$ functional groups can take part in the polymerization reactions with $H_2O_2$ leaving the Si—$CH_2$—Si backbone intact as a part of the siloxane chain, and state that a dielectric material having a dielectric constant of ~2.7 can be achieved by using methylenebis-silane in place of methyl silane as the precursor.

Attempts have been made to further lower the dielectric constant of the film by increasing the carbon content in the dielectric film using phenyl silane as the precursor. While a film having a low dielectric constant was obtained, using a phenyl silane precursor, the dielectric constant was found to vary from film to film with k values between ~2.1 to ~2.8, i.e., formation of a film with a given k value was not reproducible.

In Aronowitz et al. U.S. patent application Ser. No. 09/274,457, assigned to the assignee of this invention, and the subject matter of which is incorporated by reference into this application, a low dielectric constant carbon-containing silicon oxide dielectric material is described and claimed which is formed by reacting a mild oxidizing agent such as hydrogen peroxide with a multiple carbon-substituted silane having only primary hydrogens bonded to the carbon atoms in the multiple carbon-substituted silane precursor.

While these approaches have succeeded in lowering the dielectric constant (k) of the carbon-substituted silicon oxide dielectric material, and therefore lowering the capacitance of integrated circuit structures formed using such low k dielectric material, problems have been encountered with respect to contact openings and vias formed in such low dielectric material. Apparently the presence of carbon in the low k dielectric material renders the material more susceptible to damage during subsequent processing of the structure. For example, contact openings or vias are usually etched in the dielectric layer through a resist mask. When the resist mask is subsequently removed by an ashing process, damage can occur to the newly formed via surfaces of the low k material resulting in what is known as via poisoning wherein filler material subsequently deposited in the via, such as a titanium nitride liner and tungsten filler material, fails to adhere to the via surfaces.

Various approaches have been attempted to remedy the problem of via poisoning, including the use of special liners or the treatment of the via sidewall surfaces, either prior to the ashing step to prevent subsequent damage to the low k material surface in the via, or after the ashing step to attempt to repair the damaged surface of the low k material in the via.

Copending application Ser. No. 09/426,056, entitled "LOW K DIELECTRIC COMPOSITE LAYER FOR INTEGRATED CIRCUIT STRUCTURE WHICH PROVIDES VOID-FREE LOW K DIELECTRIC MATERIAL BETWEEN METAL LINES WHILE MITIGATING VIA POISONING", was filed by one of us with others on the same date as this application and is assigned to the same assignee as this application. The subject matter of Ser. No. 09/426,056 is also hereby incorporated by reference. In one embodiment in that application, a void-free low k silicon oxide dielectric material is formed in the high aspect regions between closely spaced apart metal lines by one of several processes, including the process used to form the first low k silicon oxide dielectric material described in the present application. A second layer of low k silicon oxide dielectric material is then deposited over the first layer and the metal lines by a process which deposits at a rate higher than the deposition rate of the void-free dielectric material. In a preferred embodiment, both of the layers are formed in the same vacuum chamber without an intervening planarization step.

Copending application Ser. No. 10/153,011 entitled "INTEGRATED CIRCUIT STRUCTURE HAVING LOW DIELECTRIC CONSTANT MATERIAL AND HAVING SILICON OXYNITRIDE CAPS OVER CLOSELY SPACED APART METAL LINES" was also filed by one of us with others on the same date as this application and is assigned to the same assignee as this application. The subject matter of Ser. No. 10/153,011 is also hereby incorporated by reference. In that application, a layer of silicon oxynitride (SiON) is formed over the top surface of the metal lines to serve as an anti-reflective coating (ARC), a hard mask for the formation of the metal lines, and a buffer layer for chemical mechanical polishing (CMP). Low k silicon oxide dielectric material having a high carbon doping level is then formed in the high aspect regions between closely spaced apart metal lines up to the level of the silicon oxynitride. CMP is then applied to planarize the upper surface of the low k carbon-doped silicon oxide dielectric layer, using the SiON layer as an etch stop, i.e., to bring the level of the void-free low k silicon oxide dielectric layer even with the top of the SiON layer. A conventional (non-low k) layer of silicon oxide dielectric material is then deposited by plasma enhanced chemical vapor deposition (PECVD) over the low k layer and the SiON layer. A via is then cut through the second dielectric layer and the SiON to the top of the metal line. Since the via never contacts the low k layer between the metal lines, via poisoning due to exposure of the low k layer by the via does not occur.

Thus it can be seen that reducing undesirable capacitance formed in an integrated circuit structure in a manner which does not give rise to the problem of via poisoning is a desirable goal.

SUMMARY OF THE INVENTION

Quite surprisingly, we have discovered that the capacitance of an integrated circuit structure may be lowered without encountering the problem of via poisoning by careful control of the carbon content of the carbon-containing low k silicon oxide dielectric material in two regions: a first region between adjacent raised conductive lines formed over an underlying insulation layer, where undesirable capacitance may be formed horizontally between such adjacent conductive lines; and a second region above the raised conductive lines where vias are normally formed extending upward from the raised conductive lines through the low k dielectric layer to an overlying layer of metal interconnects. In one embodiment, the carbon-containing low k silicon oxide dielectric material used in the first region between adjacent raised conductive lines has a high carbon content to provide maximum reduction of the dielectric constant of the dielectric material for maximum reduction in the horizontal capacitance developed between horizontally adjacent lines, while the carbon-containing low k silicon oxide dielectric material used in the second region above the raised conductive lines has a reduced carbon content to mitigate poisoning of vias formed through the dielectric material in this second region. In another embodiment both the first and second regions have the same or similar reduced carbon content in the carbon-containing low k silicon oxide dielectric material in both of the respective first and second regions.

BRIEF DESCRIPTION OF THE DRAWINGS

FIG. 1 is a fragmentary vertical cross-sectional view of a portion of an integrated circuit structure showing raised electrically conductive lines formed on an insulation layer over a semiconductor substrate containing one or more active devices such as a MOS transistor.

FIG. 2 is a fragmentary vertical cross-sectional view of the structure of FIG. 1 after formation of a first dielectric layer of conventional low k dielectric material over and in between the raised electrically conductive lines.

FIG. 3 is a fragmentary vertical cross-sectional view of the structure of FIG. 2 after planarization of the conventional low k dielectric material down to the level of the top surface of the raised electrically conductive lines.

FIG. 4 is a fragmentary vertical cross-sectional view of the structure of FIG. 3 after formation of a second dielectric layer of lower carbon content dielectric material over the planarized surface of the structure of FIG. 3.

FIG. 5 is a fragmentary vertical cross-sectional view of the structure of FIG. 4 after formation of vias in the second dielectric layer of lower carbon content dielectric material down to the underlying raised electrically conductive lines.

FIG. 6 is a fragmentary vertical cross-sectional view of the structure of FIG. 5 after filling of the vias in the second dielectric layer of lower carbon content dielectric material with electrically conductive material.

FIG. 7 is a fragmentary vertical cross-sectional view of the structure of FIG. 6 after formation of a second layer of metal lines over the high carbon low k silicon oxide dielectric layer and the filled vias.

FIG. 8 is a fragmentary vertical cross-sectional view of another embodiment of the invention showing the structure of FIG. 1 after formation of a single dielectric layer of lower carbon content dielectric material between and over the raised electrically conductive lines, with vias formed in the dielectric layer down to the raised electrically conductive lines.

FIG. 9 is a fragmentary vertical cross-sectional view of the structure of FIG. 8 after filling of the vias formed in the dielectric layer down to the raised electrically conductive lines.

FIG. 10 is a flow sheet illustrating the steps of the process for forming the first embodiment of the structure of the invention.

DETAILED DESCRIPTION OF THE INVENTION

The invention comprises an integrated circuit structure having lowered capacitance between metal lines while avoiding the problem of via poisoning by careful control of the carbon content of the dielectric material in two regions: a first region between adjacent raised conductive lines, where undesirable capacitance may be formed horizontally between such adjacent conductive lines; and a second region above the raised conductive lines where vias are normally formed extending upward from the raised conductive lines through the low k dielectric layer to an overlying metal interconnect. In one embodiment, the low k dielectric material formed in the first region between adjacent raised conductive lines has a high carbon content to provide maximum lowering of the dielectric constant of the high carbon low k silicon oxide dielectric material for maximum reduction in the horizontal capacitance developed horizontally between adjacent lines, while the low k dielectric material in the second region above the raised conductive lines has a lower carbon content whereby the use of such a low carbon low k silicon oxide dielectric material in the second region eliminates or at least mitigates poisoning of vias formed through this low carbon low k silicon oxide dielectric material in the second region.

The operability of this embodiment of the invention is based on the surprising realization that the traditional vertical capacitance formed between layers of metal interconnects was not the primary source of undesirable capacitance in integrated circuit structures having fine pitch metal lines. Rather, the primary source of capacitance in integrated circuit structure having line widths not greater than 0.5 micrometers ($\mu$m) and line spacings not greater than 0.5 $\mu$m, has been found to be the horizontal capacitance developed between such closely spaced apart metal lines on the same level of metal interconnects because of the shrinkage of the horizontal spacing between adjacent lines on the same metal interconnect level.

By use of the term "high carbon low k silicon oxide dielectric material" is meant a silicon oxide dielectric material having a carbon content of at least about 10 wt. %, preferably at least about 12 wt. %, and most preferably at least about 14 wt. % of the total weight of carbon, silicon, and oxygen in the dielectric material, resulting in a low k silicon oxide dielectric material having a dielectric constant below 3, and typically as low as 2.8.

By use of the term "low carbon low k silicon oxide dielectric material" is meant a silicon oxide dielectric material having a carbon content of at least 7 wt. %, but less than 10 wt. % of the total weight of carbon, silicon, and oxygen in the dielectric material, resulting in a low k silicon oxide dielectric material having a dielectric constant of from about 3.2 to about 3.4.

By use of the term "via poisoning" herein is meant a condition which develops on the walls of a via in a carbon-containing low k silicon oxide dielectric material which inhibits or prevents bonding of filler material to the walls of the via resulting in an unfilled or insufficiently filled via.

Turning now to FIG. 1, a silicon semiconductor substrate is shown at 2 having already constructed therein a typical integrated circuit device such as the illustrated MOS transistor comprising source/drain regions 4 and 6 formed in substrate 2 and gate electrode 10 formed over gate oxide 8 on substrate 2 between source/drain regions 4 and 6. Gate electrode 10 is spaced and electrically insulated from source/drain regions 4 and 6 by insulating sidewall spacers 12 and 14. Gate electrode 10 is formed over gate oxide 8 formed on the surface of substrate 2 above a portion of substrate 2 which will comprise the channel region between source/drain regions 4 and 6. The illustrated MOS transistor is electrically isolated from other portions of substrate 2 by field oxide shown at 20 and 22.

Still referring to FIG. 1, a first insulation layer 30, such as a planarized layer of $SiO_2$, is shown formed over substrate 2 and the MOS transistor thereon. Filled contact openings 34, 36, and 38 are shown formed in insulation layer 30 to respectively provide electrical connections to source/drain region 4, gate electrode 10, and source/drain region 6. Filled contact openings 34–38 are conventionally filled with electrically conductive materials such as titanium nitride/tungsten materials.

FIG. 1 shows a series of metal lines 42, 44, and 46 respectively formed over filled contact openings 34–38 and insulation layer 30. Each metal line has a height of from about 500 nanometers (nm) to about 1200 nm, and is shown with a respective electrically conductive thin cap portion 52, 54, and 56, i.e., of about 100 nm thickness, formed over the top surfaces of metal lines 42–46 to act as an etch stop as will be discussed below. Metal lines 42–46 and cap portions 52–56 may be formed by depositing a metal layer (not shown) over insulation layer 30 and filled contact openings 34–38, and a capping layer (also not shown) over the metal layer and then patterning the metal layer and the capping layers to form the metal interconnect illustrated by metal lines 42–46 and cap portions 52–56.

Now referring to FIG. 2, in accordance with the invention a layer of high carbon low k silicon oxide dielectric layer 70 is deposited over the structure to completely fill openings 60 and 62 formed respectively between metal lines 42–44 and metal lines 44–46 (and cap portions 52–56 thereon). Layer 70 of high carbon low k silicon oxide dielectric material is deposited over the structure to a depth or thickness which will result in a complete filling of openings or regions 60 and 62 between the metal lines as well as some deposit over the top surfaces of capping portions 52–56. Although a single layer 70 of high carbon low k silicon oxide dielectric material is described and illustrated, it will be understood that it is customary to provide a barrier layer of conventional silicon oxide (not shown) beneath layer 70 of high carbon low k silicon oxide dielectric material to prevent interaction between the high carbon low k silicon oxide dielectric material of layer 70 and underlying regions of the integrated circuit structure. This barrier layer may be from about 40 nm to about 60 nm in thickness, typically about 50 nm (500 Å).

The structure is then subjected to a planarization step to remove all of high carbon low k silicon oxide dielectric material layer 70 from the top surfaces of cap portions 52–56, leaving only high carbon low k silicon oxide dielectric material in filled regions 72 and 74 to provide the illustrated planar surface shown in FIG. 3. While any planarization step capable of providing the illustrated planar surface of FIG. 3 may be utilized in the practice of the invention, preferably the surface is subject to a chemical/mechanical polishing (CMP) process to remove the excess high carbon low k silicon oxide dielectric material of layer 70 on the upper surfaces of cap portions 52–56, and to provide a planarized surface. In such case the excess high carbon low k silicon oxide dielectric material is removed from the upper surface of layer 70 until the top surfaces of cap portions 52–56 are reached which function as an etch stop for the CMP process.

Turning now to FIG. 4, a further dielectric layer 80 of low carbon low k silicon oxide dielectric material is shown formed to a thickness of from about 600 nm to about 1000 nm over cap portions 52–56 on metal lines 42–46 and over regions 72 and 74 filled with high carbon low k silicon oxide dielectric material.

Although not described or illustrated, it will be understood that it is customary to providing a capping layer of conventional silicon oxide dielectric material over low carbon low k silicon oxide dielectric material to prevent interaction of the upper surface of layer 80 of low carbon low k silicon oxide dielectric with other materials in the integrated circuit structure. This capping layer may be from about 40 nm to about 60 nm in thickness, typically about 50 nm (500 Å).

Vias 82, 84, and 86 are shown cut through layer 80 in FIG. 5 in respective registry with underlying metal lines 42, 44, and 46. Vias 82–86 are then filled with suitable electrically conductive filler material such as a titanium nitride liner and tungsten filler material, resulting in filled vias 92, 94, and 96, as shown in FIG. 6.

The resulting structure, as shown in FIG. 7, has high carbon low k silicon oxide dielectric material formed between raised metal lines 42, 44, and 46 to provide the maximum reduction in dielectric constant in the dielectric material horizontally separating metal lines 42, 44, and 46 from one another, to thereby provide a minimum of horizontal capacitance to be developed between the metal lines. At the same time, by providing a layer of low carbon low k silicon oxide dielectric material above the metal lines where vias will be cut through such a low k dielectric layer to provide for electric connections from metal lines 42, 44, and 46 to metal interconnects 102, 104, and 106 formed over dielectric layer 80, one achieves reduction in the vertical capacitance developed between metal lines 42, 44, and 46 and metal interconnects 102, 104, and 106 formed over dielectric layer 80 without, however, increasing the carbon content of dielectric layer 80 sufficient to result in via poisoning during the formation of the vias, in particular, for example, during removal of the via mask. A further layer of low k dielectric material may then be used as the dielectric material in between metal lines 102–106 in the same manner as just described for metal lines 42–46, i.e., the process of the invention may then be repeated with subsequent layers of metal lines and dielectric layers until all layers have been applied, after which the integrated circuit structure may be conventionally completed using standard top side processing which forms no part of the current invention.

As previously defined the term "high carbon low k silicon oxide dielectric material" refers to a silicon oxide dielectric material having a carbon content of at least about 12 wt. % of the total weight of carbon, silicon, and oxygen in the dielectric material, resulting in a low k silicon oxide dielectric material having a dielectric constant below 3, and typically as low as 2.8. Such a high carbon low k silicon oxide dielectric material can be formed by reacting together a mild oxidant such as $H_2O_2$ and a carbon-substituted silane such as methyl silane ($CH_3$—$SiH_3$) or a multiple carbon-substituted silane having only primary hydrogens bonded to the carbon atoms and having the formula $SiH_x((C)_y(CH_3)_z)_{(4-x)}$, where x ranges from 1 to 3, y is an integer from 1 to 4 for a branched alkyl group and from 3 to 5 for a cyclic alkyl group and z is 2y+1 for a branched alkyl group and 2y−1 for a cyclic alkyl group, such as described in the previously referenced Aronowitz et al. Ser. No. 09/274,457.

The reactants, e.g., $H_2O_2$ and $CH_3$—$SiH_3$, are fed in a gaseous state into a reaction chamber advantageously maintained at a pressure of from about 0.1 Torr to about 50 Torr, preferably from about 1 Torr to about 10 Torr, and most preferably from about 1 Torr to about 5 Torr. and at a temperature of from about 70° C. to about 100° C. During the reaction and deposition, the temperature of the silicon substrate in the reaction chamber is maintained below ambient (~25° C.), and preferably below about 5° C., to avoid fast cross-linking of the reaction product as it forms. The reaction is carried out for a period of time sufficient to form the layer of low k dielectric material to the desired thickness over the integrated circuit structure already formed on the silicon substrate. In the embodiment just described, the minimum thickness will be sufficient to deposit in the region between the raised lines a thickness at least equal to the height of the raised lines. The resulting deposition of high carbon low k silicon oxide dielectric material may then be subject to an anneal such as a furnace anneal at about 400° C. for about 30 minutes to remove any moisture remaining from the reaction.

When the previously defined "low carbon low k silicon oxide dielectric material is to be formed, e.g., in the second region above the first region in the above described embodiment, the same reaction condition may be used except that a portion of the carbon-substituted silane in the original reactants is replaced by unsubstituted silane ($SiH_4$) in an amount ranging from about 40 atomic % silane/60 atomic % carbon-substituted silane to about 75 atomic % silane/25 atomic % carbon-substituted silane. To provide for the maximum carbon substitution and resulting lowering of the dielectric constant k while still providing protection against via poisoning, the amount of unsubstituted (no carbon) silane used in the reaction to form the low carbon low k silicon oxide dielectric material should preferably range from about 40 atomic % to about 60 atomic % silane, and most preferably from about 40 atomic % to about 50 atomic % silane.

Turning now to FIGS. 8 and 9, another embodiment of the invention is illustrated wherein a single layer of low carbon low k silicon oxide dielectric material, denoted as 80' in FIGS. 8 and 9, is used in both regions, i.e., in the first region between raised metal lines 42, 44, and 46 where high carbon low k silicon oxide dielectric material 72 and 74 was formed in the previous embodiment, and also in the second region above metal lines 42–46 and dielectric material 72 and 74 in the first region, where vias 82, 84, and 86 are formed to provide electrical contact with a further layer of metal interconnects (not shown in FIGS. 8 and 9) which will be formed above filled vias 92, 94, and 96, as shown in FIG. 7 of the previous embodiment.

It will be noted that cap portions 52–56 previously shown respectively formed on the top surfaces of metal lines 42–46 have been eliminated in this embodiment because there is no need for an intermediate planarization step in the process used in this embodiment, and therefore, no need for an etch stop protective cap over metal lines 42–46. Layer 80' of low carbon low k silicon oxide dielectric material used in this embodiment is made using the previously described process for forming the low carbon low k silicon oxide dielectric material, e.g., by substituting silane for some of the carbon-substituted silane in the reaction with the mild oxidizing agent such as $H_2O_2$. However, since the resulting low carbon low k silicon oxide material will also be used in the first region, i.e., in the areas between metal lines 42–46 where horizontal capacitance may be generated between the metal lines, it is important to carry out the reaction at the low end of the unsubstituted silane range, i.e., to use an amount of unsubstituted silane ranging from about 40 atomic % silane to about 50 atomic % silane. This will result in a sufficient amount of carbon present in the final low carbon low k silicon oxide dielectric material to provide the desired lowering of the horizontal capacitance between metal lines 42–46, while still keeping the carbon content low enough to avoid via poisoning in vias 82–86 formed in the same dielectric material in the second region above the metal lines 42–46 where vias 82–86 will be formed to connect metal lines 42–46 to another level of metal lines or interconnects.

This embodiment relies on the discovery of a narrow window of carbon concentration in the carbon-containing low k silicon oxide dielectric material wherein the concentration of carbon in the silicon oxide dielectric material is high enough to lower the dielectric constant of the silicon oxide dielectric material down to a level wherein the amount of capacitance developed between conductive portions separated by such carbon-containing silicon oxide is acceptable, while at the same time not resulting in via poisoning due to high concentrations of carbon in the silicon oxide dielectric material through which the vias are cut. The carbon content of the carbon-containing low k silicon oxide dielectric material in the first and second regions ranges from about 6 wt. % to about 9 wt. % of the total weight of silicon, oxygen, and carbon in the carbon-containing low k silicon oxide dielectric material in the first and second regions.

It should be further noted that to further reduce the horizontal capacitance developed between metal lines 42–46 in this second embodiment, the deposition could also be carried out initially without the dilution of the carbon-substituted silane with unsubstituted silane ($SiH_4$), with the flow of unsubstituted silane then commenced just prior to the deposition reaching the top of metal lines 42–46 so that most of the dielectric material deposited between metal lines 42–46 would be high carbon low k silicon oxide dielectric material, while all of the dielectric material deposited above metal lines 42–46 would be the desired low carbon low k silicon oxide dielectric material. In this manner, the deposition of the dielectric material between the metal lines would have a lower dielectric constant than that of the low carbon low k silicon oxide dielectric material deposited over the metal lines so that poisoning of the vias would still be avoided while minimizing the horizontal capacitance between the metal lines. The amount of deposition time for the undiluted carbon-substituted silane versus the deposition time for the flow of carbon-substituted silane mixed with unsubstituted silane could then be determined empirically for each wafer type.

The following examples will serve to better illustrate the invention.

EXAMPLE I

Three 8 inch diameter silicon wafers were each provided with a series of parallel metal lines formed over an insulation layer on the surfaces of the respective wafers. The metal lines were each 270 nm wide, 500 nm in height, with a spacing of 270 nm between the metal lines. An etch stop or capping layer of titanium nitride of about 100 nm thickness was formed over the top surfaces of the metal lines to function as an etch stop barrier for subsequent planarizing of the wafer. A 50 nm thick barrier layer of undoped (no carbon) layer of silicon oxide was then deposited over each of the wafers by plasma enhanced chemical vapor deposition (PECVD).

The first wafer was then placed in a 10 liter deposition reactor maintained at a temperature of 5° C. and a pressure of 10 Torr, with the wafer itself maintained at a temperature of about 25° C. A first layer of high carbon low k silicon oxide dielectric material was then formed over and in between the raised metal lines by flowing 70 sccm of methyl-silane ($CH_3$—$SiH_3$) and 0.75 grams/minute (g/min) of hydrogen peroxide ($H_2O_2$) into the reactor for 0.5 minutes to deposit sufficient high carbon low k silicon oxide dielectric material on the wafer to cover the titanium nitride capping layer and the silicon oxide barrier layer on the metal lines.

The coated wafer was then removed from the reactor and heat treated for about 3 minutes at a temperature of between about 400° C. and 450° C. The wafer was then moved to a planarization apparatus where the coated wafer was subjected to a chemical mechanical polishing (CMP) step to remove all of the high carbon low k silicon oxide dielectric material down to the capping layer of nitride on the upper surface of the metal lines, leaving a planarized structure with the upper surface of the high carbon low k silicon oxide dielectric material even with the upper surface of the nitride etch stop layer on the metal lines.

The planarized wafer was then returned to the deposition reactor and subjected to a further deposition to deposit about 600 nm of low carbon low k silicon oxide dielectric material over the planarized surface of the wafer by flowing into the reactor 0.75 g/min of hydrogen peroxide ($H_2O_2$) and 70 sccm of a mixture of methyl-silane ($CH_3$—$SiH_3$) and silane ($SiH_4$) in a ratio of 60 atomic % methyl-silane and 40 atomic % silane. The wafer was then moved to a separate chamber where 100 nm of a capping layer of undoped (no carbon) silicon oxide was then deposited over the layer of low carbon low k silicon oxide dielectric material by PECVD.

A series of vias, each having an aspect ratio of 2, were then etched through the capping layer and the layer of low carbon low k silicon oxide dielectric material down to the nitride surfaces of the underlying metal lines, using a photoresist mask. The mask was then removed by a conventional ashing process consisting of $H_2O$ plasma. The vias were then lined with a 50 nm thick layer of titanium nitride and then filled with tungsten.

The second wafer was processed similarly, except that the deposition of high carbon low k silicon oxide dielectric material was not stopped at the level of the top surfaces of the metal lines, and the CMP step was eliminated. Instead, the entire thickness of carbon-containing low k silicon oxide dielectric material comprised the high carbon low k silicon oxide dielectric material, i.e., no low carbon low k silicon oxide dielectric material was deposited, resulting in the vias being cut through high carbon low k silicon oxide dielectric material. The vias were then filled similarly to the filling of the vias in the first wafer.

The third wafer was processed similarly to the second wafer, except that the entire deposition of silicon oxide dielectric material contained no carbon, i.e., a standard layer of silicon oxide was formed by reacting silane with hydrogen peroxide in the reactor, resulting in the vias being subsequently cut through standard (high k) silicon oxide dielectric material. The vias were then filled similarly to the filling of the vias in the first and second wafer.

Each wafer was then examined under a 50× microscope to determine the percentage of filled vias in each wafer, to determine the extent of via poisoning by the carbon in the carbon-containing silicon oxide high k dielectric materials. The first wafer, having the upper layer of low carbon low k silicon oxide dielectric material through which the vias were cut, had substantially 100% of the vias filled, indicating little if any via poisoning. Similar results were noted for the third wafer wherein the vias were cut through standard silicon oxide (no carbon). However, the second wafer, having all high carbon low k silicon oxide dielectric material, including the regions where the vias were cut, showed a via filling of only about 50%, indicating severe via poisoning.

EXAMPLE II

A fourth wafer was subject to the same treatment as in Example I, except that in the processing of this fourth wafer, after forming the 50 nm silicon oxide barrier layer, a single deposition of carbon-containing low k silicon oxide dielectric material was made by flowing into the reactor 0.75 g/min of hydrogen peroxide ($H_2O_2$) and 70 sccm of a mixture of methyl-silane ($CH_3$—$SiH_3$) and silane ($SiH_4$) in a ratio of 60 atomic % methyl-silane and 40 atomic % silane.

The deposition was carried out until a thickness of low carbon low k silicon oxide dielectric material had deposited over the top surfaces of the metal lines equal to the thickness of the same material deposited over the first wafer in Example I.

As in Example I, 100 nm capping layer of undoped (no carbon) silicon oxide was then deposited over the layer of low carbon low k silicon oxide dielectric material by PECVD. The vias in the fourth wafer were then cut through the same low carbon low k silicon oxide dielectric material used to fill the spaces between the metal lines. The vias were then filled with the same materials as in Example I.

When the fourth wafer was then examined under a 50× microscope to determine the percentage of filled vias in each wafer, indicative of the extent of via poisoning by the carbon in the carbon-containing silicon oxide high k dielectric materials, the number of filled vias was substantially equal to the results with the first wafer of Example I, indicating the same lack of via poisoning.

Thus, the invention provides for the lowering of horizontal capacitance developed between metal lines at the same level in an integrated circuit structure while substantially eliminating the problem of via poisoning by careful control of the carbon content of carbon-containing low k silicon oxide dielectric material in two regions of the integrated circuit structure, a first region between adjacent raised conductive lines formed over an underlying insulation layer, where undesirable capacitance may be formed horizontally between such adjacent conductive lines; and a second region above the raised conductive lines where vias are normally formed extending upward from the raised conductive lines through the low k dielectric layer to an overlying layer of metal interconnects.

Having thus described the invention what is claimed is:

1. In an integrated circuit structure wherein the capacitance between nearby conductive portions in the integrated circuit structure is lowered by carbon-containing low k silicon oxide dielectric material, the improvement which comprises:
   a) a first region between adjacent raised conductive lines formed over an underlying insulation layer comprising a carbon-containing low k silicon oxide dielectric material having a carbon content capable of reducing undesirable capacitance from forming horizontally between said adjacent raised conductive lines; and
   b) a second region above said raised conductive lines where vias are normally formed extending upward from said raised conductive lines to an overlying layer of metal interconnects comprising a carbon-containing low k silicon oxide dielectric material having a carbon content capable of inhibiting via poisoning of said vias in said dielectric material.

2. The integrated circuit structure of claim 1 wherein said carbon-containing low k silicon oxide dielectric material in said first region comprises a high carbon low k silicon oxide dielectric material to thereby lower the undesirable capacitance formed horizontally between said adjacent raised conductive lines in said first region.

3. The integrated circuit structure of claim 2 wherein said high carbon low k silicon oxide dielectric material has a carbon content of at least about 10 wt. % of the total weight of silicon, oxygen, and carbon in said high carbon low k silicon oxide dielectric material in said first region.

4. The integrated circuit structure of claim 2 wherein said high carbon low k silicon oxide dielectric material has a carbon content of at least about 12 wt. % of the total weight of silicon, oxygen, and carbon in said high carbon low k silicon oxide dielectric material in said first region.

5. The integrated circuit structure of claim 2 wherein said high carbon low k silicon oxide dielectric material has a carbon content of at least about 13 wt. % of the total weight of silicon, oxygen, and carbon in said high carbon low k silicon oxide dielectric material in said first region.

6. The integrated circuit structure of claim 1 wherein said carbon-containing low k silicon oxide dielectric material in said second region comprises a low carbon low k silicon oxide dielectric material to thereby reduce the problem of via poisoning in vias formed in said second region.

7. The integrated circuit structure of claim 6 wherein said low carbon low k silicon oxide dielectric material has a carbon content of at least about 7 wt. %, but less than 10 wt. % of the total weight of silicon, oxygen, and carbon in said low carbon low k silicon oxide dielectric material.

8. The integrated circuit structure of claim 1 wherein said carbon content of said carbon-containing low k silicon oxide dielectric material in said first region is about the same as said carbon content of said carbon-containing low k silicon oxide dielectric material in said second region.

9. The integrated circuit structure of claim 8 wherein said carbon content of said carbon-containing low k silicon oxide dielectric material in said first and second regions ranges from about 7 wt. % to about 8 wt. % of the total weight of silicon, oxygen, and carbon in said carbon-containing low k silicon oxide dielectric material in said first and second regions.

10. In an integrated circuit structure wherein the capacitance between nearby conductive portions in the integrated circuit structure is lowered by carbon-containing low k silicon oxide dielectric material, the improvement which comprises:
    a) a first region between adjacent raised conductive lines formed over an underlying insulation layer comprising a high carbon low k silicon oxide dielectric material capable of reducing undesirable capacitance from forming horizontally between said adjacent raised conductive lines; and
    b) a second region above said raised conductive lines where vias extend upward from said raised conductive lines to an overlying layer of metal interconnects comprising a low carbon low k silicon oxide dielectric material capable of inhibiting via poisoning of said vias in said dielectric material.

11. The integrated circuit structure of claim 10 wherein said high carbon low k silicon oxide dielectric material has a carbon content of at least about 10 wt. % of the total weight of silicon, oxygen, and carbon in said high carbon low k silicon oxide dielectric material in said first region.

12. The integrated circuit structure of claim 10 wherein said high carbon low k silicon oxide dielectric material has a carbon content of at least about 12 wt. % of the total weight of silicon, oxygen, and carbon in said high carbon low k silicon oxide dielectric material in said first region.

13. The integrated circuit structure of claim 10 wherein said high carbon low k silicon oxide dielectric material has a carbon content of at least about 13 wt. % of the total weight of silicon, oxygen, and carbon in said high carbon low k silicon oxide dielectric material in said first region.

14. The integrated circuit structure of claim 10 wherein said low carbon low k silicon oxide dielectric material has a carbon content of at least about 7 wt. %, but less than 10 wt. % of the total weight of silicon, oxygen, and carbon in said low carbon low k silicon oxide dielectric material.

15. An integrated circuit structure wherein the capacitance between nearby conductive portions in the integrated circuit structure is lowered by carbon-containing low k silicon oxide dielectric material, while via poisoning is suppressed which comprises:

a) a first region between adjacent raised conductive lines formed over an underlying insulation layer where undesirable capacitance is capable of forming horizontally between said adjacent raised conductive lines;

b) a second region above said raised conductive lines where vias extend upward from said raised conductive lines to an overlying layer of metal interconnects; and c) a carbon-containing low k silicon oxide dielectric material in said first and second regions of said structure having a carbon content capable of reducing horizontal capacitance formed in said first region of said structure, and capable of inhibiting via poisoning of vias formed in said second region of said structure.

16. The integrated circuit structure of claim 15 wherein said carbon-containing low k silicon oxide dielectric material has a carbon content of at least about 7 wt. %, but less than 10 wt.% of the total weight of silicon, oxygen, and carbon in said carbon-containing low k silicon oxide dielectric material.

17. The integrated circuit structure of claim 15 wherein said carbon content of said carbon-containing low k silicon oxide dielectric material in said first and second regions ranges from about 7 wt. % to about 8 wt. % of the total weight of silicon, oxygen, and carbon in said carbon-containing low k silicon oxide dielectric material in said first and second regions.

18. In a process for making an integrated circuit structure wherein the capacitance between nearby conductive portions in the integrated circuit structure is lowered by carbon-containing low k silicon oxide dielectric material, the improvement which comprises lowering the capacitance in said integrated circuit structure while reducing via poisoning by controlling the carbon content of said dielectric material in two regions of the integrated circuit structure comprising:

a) forming a carbon-containing low k silicon oxide dielectric material in a first region between adjacent raised conductive lines formed over an underlying insulation layer, where undesirable capacitance may be formed horizontally between said adjacent raised conductive lines; and b) forming a carbon-containing low k silicon oxide dielectric material in a second region above said raised conductive lines where vias extend upward from said raised conductive lines through said dielectric layer to an overlying layer of metal interconnects.

19. The process of claim 18 wherein said step of forming said carbon-containing low k silicon oxide dielectric material in said first region further comprises forming a high carbon low k silicon oxide dielectric material to thereby lower the undesirable capacitance formed horizontally between said adjacent raised conductive lines in said first region.

20. The process of claim 18 wherein said step of forming said carbon-containing low k silicon oxide dielectric material in said second region further comprises forming a low carbon low k silicon oxide dielectric material to thereby reduce the problem of via poisoning in vias formed in said second region.

21. The process of claim 18 wherein said steps of forming said carbon-containing low k silicon oxide dielectric material in said first and second regions further comprises forming the same carbon-containing low k silicon oxide dielectric material in both said first and second regions, said same carbon-containing low k silicon oxide dielectric material having a carbon content sufficient to lower the undesirable capacitance formed horizontally between said adjacent raised conductive lines in said first region, but insufficient to cause via poisoning in vias formed in said second region.

22. In an integrated circuit structure wherein the capacitance between nearby conductive portions in the integrated circuit structure is lowered by carbon-containing low k silicon oxide dielectric material, the improvement which comprises:

a) a first region between adjacent raised conductive lines formed over an underlying insulation layer comprising a high carbon low k silicon oxide dielectric material capable of reducing undesirable capacitance from forming horizontally between said adjacent raised conductive lines; and b) a second region above said raised conductive lines where vias extend upward from said raised conductive lines to an overlying layer of metal interconnects comprising a low carbon low k silicon oxide dielectric material capable of inhibiting via poisoning of said vias in said dielectric material, said low carbon low k silicon oxide dielectric material having a carbon content of at least about 7 wt. %, but less than 10 wt. % of the total weight of silicon, oxygen, and carbon in said low carbon low k silicon oxide dielectric material.

23. An integrated circuit structure wherein the capacitance between nearby conductive portions in the integrated circuit structure is lowered by carbon-containing low k silicon oxide dielectric material, while via poisoning is suppressed which comprises:

a) a first region between adjacent raised conductive lines formed over an underlying insulation layer where undesirable capacitance is capable of forming horizontally between said adjacent raised conductive lines;

b) a second region above said raised conductive lines where vias extend upward from said raised conductive lines to an overlying layer of metal interconnects; and c) a carbon-containing low k silicon oxide dielectric material in said first and second regions of said structure having a carbon content of at least about 7 wt. %, but less than 10 wt. % of the total weight of silicon, oxygen, and carbon in said carbon-containing low k silicon oxide dielectric material;

whereby said carbon content of said carbon-containing low k silicon oxide dielectric material is capable of reducing horizontal capacitance formed in said first region of said structure, and capable of inhibiting via poisoning of vias formed in said second region of said structure.

24. In a process for making an integrated circuit structure wherein the capacitance between nearby conductive portions in the integrated circuit structure is lowered by carbon-containing low k silicon oxide dielectric material, the improvement which comprises lowering the capacitance in said integrated circuit structure while reducing the problem of via poisoning by controlling the carbon content of said dielectric material in two regions of the integrated circuit structure comprising:

a) depositing a carbon-containing low k silicon oxide dielectric material in a first region between adjacent raised conductive lines formed over an underlying insulation layer, where undesirable capacitance is capable of being formed horizontally between said adjacent raised conductive lines;

b) commencing flow of unsubstituted silane just prior to the deposition of step (a) reaching the top of said adjacent raised conductive lines to lower the carbon in the carbon-containing low k silicon oxide dielectric material at the top of said first region; and c) depositing a carbon-containing low k silicon oxide dielectric material in a second region above said raised conductive lines where vias extend upward from said raised conductive lines through the dielectric material in said second region to an overlying layer of metal interconnects.

* * * * *